United States Patent
Huang et al.

(10) Patent No.: US 9,704,820 B1
(45) Date of Patent: Jul. 11, 2017

(54) SEMICONDUCTOR MANUFACTURING METHOD AND ASSOCIATED SEMICONDUCTOR MANUFACTURING SYSTEM

(71) Applicant: TAIWAN SEMICONDUCTOR MANUFACTURING COMPANY LTD., Hsinchu (TW)

(72) Inventors: Xin-Hua Huang, Changhua County (TW); Yung-Lung Lin, Taichung (TW); Ping-Yin Liu, Taipei County (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/054,907

(22) Filed: Feb. 26, 2016

(51) Int. Cl.
*H01L 21/67* (2006.01)
*H01L 23/00* (2006.01)
*H01L 21/50* (2006.01)
*H01L 21/02* (2006.01)
*H01L 21/687* (2006.01)

(52) U.S. Cl.
CPC ........ *H01L 24/27* (2013.01); *H01L 21/02049* (2013.01); *H01L 21/68764* (2013.01); *H01L 24/29* (2013.01); *H01L 24/743* (2013.01); *H01L 2224/2781* (2013.01); *H01L 2224/75343* (2013.01); *H01L 2224/83205* (2013.01)

(58) Field of Classification Search
CPC .......................... H01L 24/27; H01L 21/67109
USPC .......................................................... 438/107
See application file for complete search history.

(56) References Cited

U.S. PATENT DOCUMENTS

| 4,538,462 | A  | * | 9/1985  | Hartog    | G01N 19/04 73/577          |
|-----------|----|---|---------|-----------|----------------------------|
| 5,380,387 | A  | * | 1/1995  | Salamon   | B29D 11/00942 156/154      |
| 5,893,746 | A  | * | 4/1999  | Usami     | H01L 21/6835 257/E21.505   |
| 2011/0048611 | A1 | * | 3/2011 | Carre     | H01L 21/6835 156/73.1      |
| 2011/0308364 | A1 | * | 12/2011| Kozak     | G02B 6/245 83/22           |
| 2012/0034437 | A1 | * | 2/2012 | Puligadda | H01L 21/2007 428/212       |
| 2012/0118510 | A1 | * | 5/2012 | Banda     | B32B 38/10 156/704         |
| 2012/0234497 | A1 | * | 9/2012 | Han       | H01L 21/67092 156/701      |
| 2016/0093518 | A1 | * | 3/2016 | Jung      | B32B 38/10 156/751         |

(Continued)

*Primary Examiner* — Moazzam Hossain
(74) *Attorney, Agent, or Firm* — WPAT, P.C., Intellectual Property Attorneys; Anthony King (57) ABSTRACT

A semiconductor manufacturing method is disclosed. The method includes: providing a first wafer and a second wafer, wherein the first wafer and the second wafer are bonded together; submerging the bonded first and second wafers in an ultrasonic transmitting medium; producing ultrasonic waves; and directing the ultrasonic waves to the bonded first and second wafers through the ultrasonic transmitting medium for a predetermined time period. An associated semiconductor manufacturing system for at least weakening a bonding strength of bonded wafers is also disclosed.

17 Claims, 7 Drawing Sheets

(56) References Cited

U.S. PATENT DOCUMENTS

2017/0062381 A1\* 3/2017 Ikoma ................ H01L 21/4882

\* cited by examiner

SEMICONDUCTOR MANUFACTURING METHOD AND ASSOCIATED SEMICONDUCTOR MANUFACTURING SYSTEM

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of decreased length of interconnects between the stacked dies, as examples.

Some methods of forming 3DICs involve bonding together two semiconductor wafers. Wafers may be bonded together using fusion bonding, eutectic bonding, and hybrid bonding, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
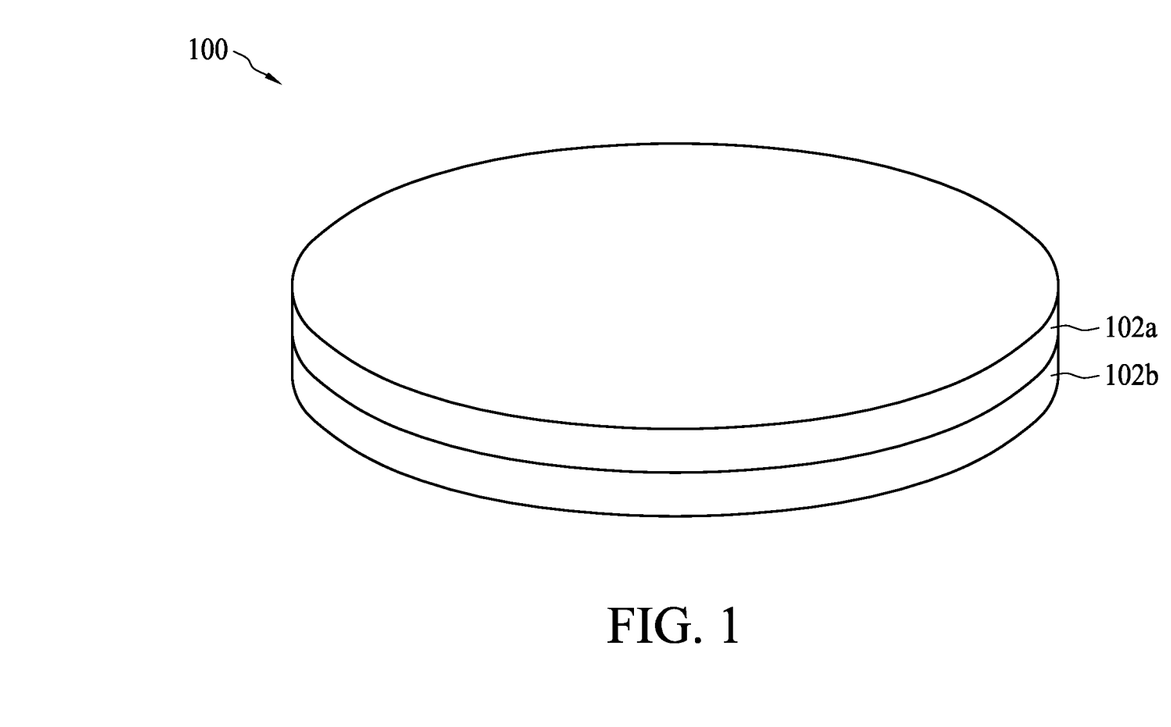
FIG. 1 is a perspective view of bonded wafers including two wafers in accordance with an exemplary embodiment of the present disclosure.

Referring to FIG. 1, a perspective view of bonded wafers 100 including two wafers 102 *a* and 102 *b* is illustrated in accordance with an exemplary embodiment of the present disclosure. Each of the wafers 102 *a* and 102 *b* may be comprised of a semiconductor wafer or other type of wafer or workpiece. The wafers 102 *a* and 102 *b* may be bonded together in a 3DIC packaging process. For example, the wafers 102 *a* and 102 *b* may be bonded together using eutectic bonding, hybrid bonding, fusion bonding, anodic bonding and/or thermo-compression bonding. However, this is not a limitation of the present disclosure. The wafers 102 *a* and 102 *b* may be alternatively bonded together using other wafer-to-wafer bonding techniques.

Figure 2:
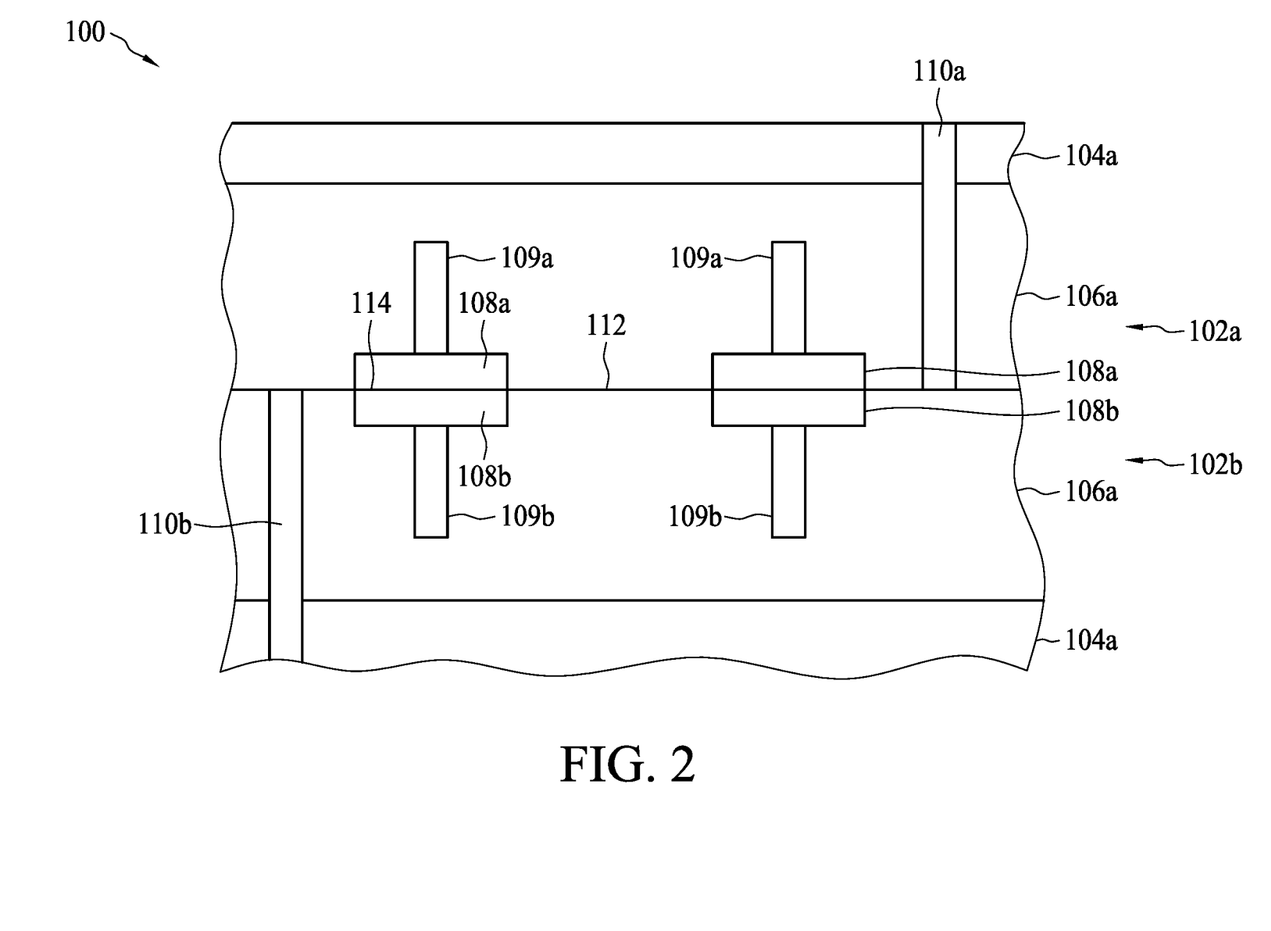
FIG. 2 is a partially enlarged cross-sectional view of the bonded wafers shown in FIG. 1.

FIG. 2 is a partially enlarged cross-sectional view of the bonded wafers 100 shown in FIG. 1. Each of the wafers 102 a and 102 b includes a workpiece 104 a and 104 b, respectively. The workpieces 104 a and 104 b may include a semiconductor substrate including silicon or other semiconductor materials and may be covered by an insulating layer, for example. The workpieces 104 a and 104 b may also include other active components or circuits. The workpieces 104 a and 104 b may be comprised of silicon oxide over single-crystal silicon, for example. The workpieces 104 a and 104 b may include conductive layers and semiconductor elements, such as transistors, diodes, capacitors, etc. Compound semiconductors, GaAs, InP, Si/Ge, or SiC, as examples, may be used in place of silicon. The workpieces 104 a and 104 b may each include a silicon-on-insulator (SOT) or a germanium-on-insulator (GOI) substrate, as examples.

Each of the wafers 102 a and 102 b is fabricated separately and later bonded together. The wafers 102 a and 102 b may include the same or similar types of devices. In some embodiments, the wafers 102 a and 102 b may alternatively include different types of devices formed thereon.

The wafers 102 a and 102 b may include an insulating material 106 a and 106 b, respectively, formed at a top surface thereof. The wafer 102 a may be inverted prior to being bonded to the wafers 102 b, as illustrated in FIG. 2. Conductive lines or contact pads 108 a and 108 b, respectively, may be formed in the insulating materials 106 a and 106 b of the wafers 102 a and 102 b. Vias 109 a and 109 b may be disposed in the insulating materials 106 a and 106 b of the wafers 102 a and 102 b and respectively coupled to the conductive lines or contact pads 108 a and 108 b. The upper portion of the wafers 102 a and 102 b may include metallization layers.

The insulating materials 106 a and 106 b may be comprised of silicon dioxide, silicon nitride, other types of insulating material layers, or multiple layers or combinations thereof, as examples. The conductive lines or contact pads 108 a and 108 b and vias 109 a and 109 b may be comprised of Cu, Al, seed layers, liners, other materials, or multiple layers or combinations thereof, as examples. However, this is not a limitation of the present disclosure. In some embodiments, the conductive lines or contact pads 108 a and 108 b, vias 109 a and 109 b, and insulating materials 106 a and 106 b may include other materials. In some embodiments, the wafers 102 a and 102 b may further include other layers of conductive lines and vias.

The wafers 102 a and 102 b may include through substrate vias (TSVs) 110 a and 110 b. The TSV 110 a and 110 b may be comprised of conductive or semiconductive materials. The TSVs provide electrical connections vertically from top to bottom surfaces of the wafers 102 a and 102 b, for example. Alternatively, the TSV's may comprise other materials.

During the bonding of the wafers 102 a and 102 b, insulator-to-insulator bonds 112 and/or metal-to-metal bonds 114 are formed therebetween. The insulator-to-insulator bonds 112 are formed between the insulating materials 106 a and 106 b, and the metal-to-metal bonds 114 are formed between the conductive lines 108 a and 108 b. However, this is not a limitation of the present disclosure. In some embodiments, depending on the type of bonding process, it may be feasible to apply merely the insulator-to-insulator bonds 112 or the metal-to-metal bonds 114. Since bonding strength is provided by the insulator-to-insulator bonds 112 and/or the metal-to-metal bonds 114, the patterns, in particular a total area, of the insulator-to-insulator bonds 112 and/or the metal-to-metal bonds 114 can highly affect the entire bonding strength of the bonded wafers 100.

After the bonding process for the bonded wafers 100 is at least partially completed, a bonding result may be determined through a specified inspection operation. If the bonding result indicates the bonding of the wafers 102 a and 102 b is not qualified, for example, a desired bonding quality is not achieved or defects are detected, a deboning process may be performed upon the bonded wafers 100 in order to separate the wafer 102 a from the wafer 102 b. The wafers 102 a and 102 b debonded from each other may be re-used in another wafer bonding process. If the bonding result indicates the bonding of the wafers 102 a and 102 b is qualified, a post-bonding process such as an anneal process may be performed upon the bonded wafers 100 to strengthen the metal-to-metal bonds 114 and/or the insulator-to-insulator bonds 112.

Existing methods or mechanisms proposed for weakening or debonding the bonding of the bonded wafers generally require applying a certain amount of destructive force at one point or a certain area. For example, a syringe type blade may be inserted to an interface between two bonded wafers from an edge in order to pry open or facilitate a peeling process concurrently performed. Even if the wafers are rigid, some amount of tensile bending stress or surface damages may be created as a consequence inevitably. In order to avoid wafer breakage or detrimental effect on any functional devices already formed on the wafers, any destructive force or the tensile bending stress caused by the prying off or peeling process should be desirably minimized. The system and method of the present disclosure, by utilizing an ultrasonic wave during the debonding process, can aid to reduce or eliminate the application of inserting a blade and bending stress during the debonding process.

Figure 3:
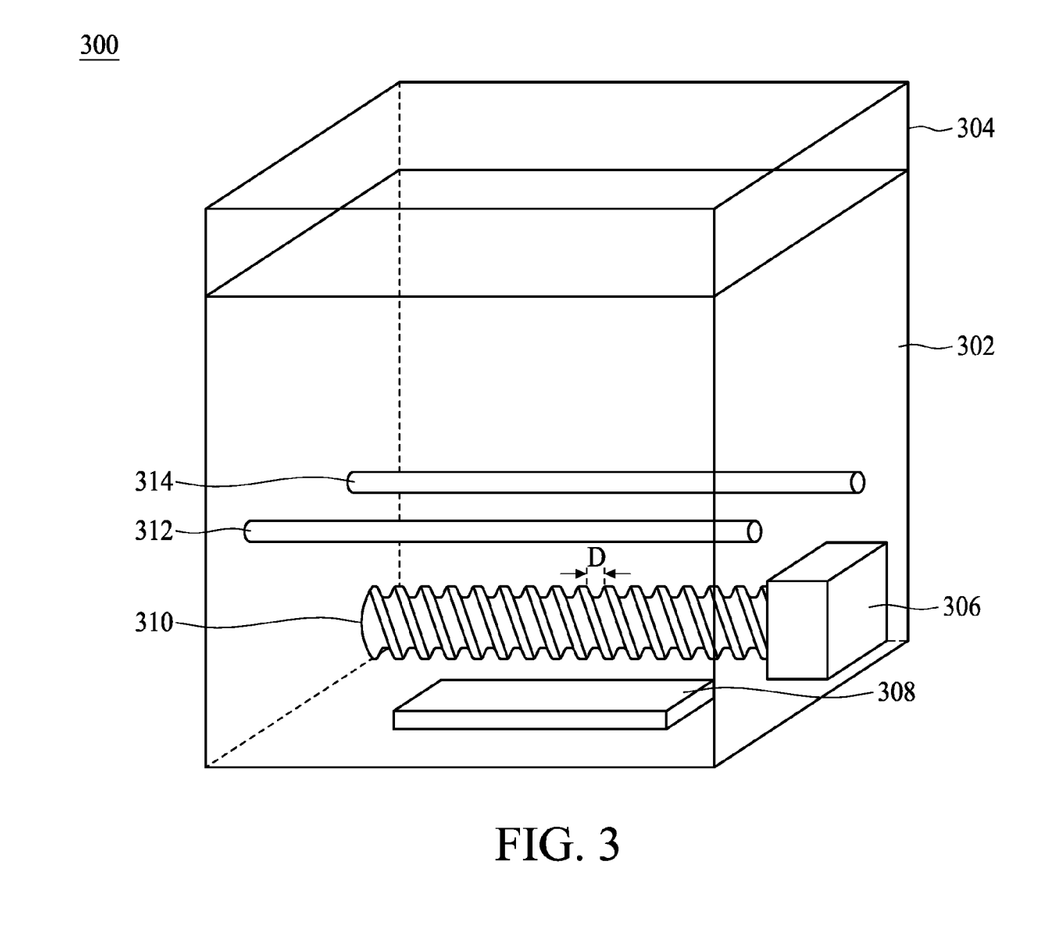
FIG. 3 is a schematic view illustrating a semiconductor manufacturing system for at least weakening the bonding of the bonded wafers in accordance with an exemplary embodiment of the present disclosure.

The application of utilizing an ultrasonic wave during the debonding process mentioned above can be carried out in various ways. FIG. 3 is a schematic view illustrating a semiconductor manufacturing system 300 for at least weakening the bonding of the bonded wafers 100 in accordance with an exemplary embodiment of the present disclosure. The system 300 may be configured to weakening the bonding of the bonded wafers 100 through the ultrasonic wave. In some embodiments, the system 300 may be configured to weakening the bonding of the bonded wafers 100 to a certain extent so that the wafer 102 a can be debonded or separated from the wafer 102 b through the ultrasonic wave.

The system 300 includes a container 304. For example, the container 304 may be a wafer tank utilized for at least containing the bonded wafers 100. Referring now to FIG. 3, the container 304 may be characterized by four side walls surround and vertically interface with a horizontal bottom base. A top surface of the container 304 may be left wide open. However, this is not a limitation of the present disclosure. In some embodiments, the top surface of the container 304 may be partially covered. In some embodiments, the top surface of the container 304 may be sealed. The container 304 may be constructed out of any suitable material, for example, glass or metal, for providing at a minimum the desired features described hereinafter.

The system 300 further includes an ultrasonic wave producing means 308 located within the container 304. The ultrasonic wave producing means 308 may be disposed on a substantially center point of the bottom base, such that the ultrasonic waves of acoustic energy produced thereby are more evenly distributed within the container 304. However, this is not a limitation of the present disclosure. As long as the ultrasonic wave produced by the ultrasonic wave producing means 308 can be directed or transferred to the bonded wafers 100, any other suitable places all fall within the scope of the present disclosure. For example, in some embodiments, the ultrasonic wave producing means 308 may be disposed on the sidewalls of the container 304 surrounding the bonded wafers 100.

The ultrasonic wave producing means 308 is capable of producing ultrasonic waves of acoustic energy having a specified acoustic power density per square centimeter ($W/cm^2$). In some embodiments, the ultrasonic wave producing means 308 may be a focused ultrasonic wave producing means for providing focused ultrasonic waves of acoustic energy with a specified acoustic focal length. The ultrasonic wave producing means 308 may be energized by a suitable radio frequency (RF) generator (not shown in FIG. 3), the RF generator being electrically connected to the ultrasonic wave producing means 308. The RF generator is appropriately controlled for providing a desired RF signal output to the ultrasonic wave producing means 308. That is, the RF generator is controlled for enabling the ultrasonic wave producing means 308 to be operable at a frequency within a specified range.

The system 300 further includes a screw 310 disposed in the container 304. In some embodiments, the screw 310 may be disposed in the container 304 and above the ultrasonic wave producing means 308. A motor 306 is disposed outside the container 304 and coupled to the screw 310. However, this is not a limitation of the present disclosure. In some embodiments, the motor 306 may be disposed inside the container 304 and coupled to the screw 310. The motor 306 includes an electric motor (not shown in FIG. 3) adapted to provide a rotary output in an embodiment. In some embodiments, the motor 306 can be a servomotor or a step motor. In other words, the motor 306 is utilized to rotate the screw 310. Alternatively, other types of motors and linear actuators may be used. The screw 310 may include a mechanical linear actuator that translates rotational motion of the motor 306 to linear motion in an embodiment. The screw 310 has a screw thread thereon. A screw thread pitch D of the screw 310 may be greater than about a thickness of the bonded wafers 100. The screw 310 may be constructed out of any suitable material, for example, metal, for providing at a minimum the desired features described hereinafter.

The system 300 further includes supporters 312 and 314. The supporters 312 and 314 may be in a cylindrical shape. The supporters 312 and 314 may be disposed above the screw 310. In some embodiments, two ends of the supporters 312 and 314 may be fixed to the two opposite side walls of the container 304. In some embodiments, the supporters 312 and 314 may be fixed at the same height. However, this is not a limitation of the present disclosure. In some embodiments, the supporters 312 and 314 may be in any suitable shape. In some embodiments, two ends of the supporters 312 and 314 may be fixed through any suitable mechanism. In some embodiments, the supporters 312 and 314 may be fixed at different heights. The supporters 312 and 314 may be constructed out of any suitable material, for example, Polytetrafluoroethylene (PTFE)-based Teflon, for providing at a minimum the desired features described hereinafter.

Figure 4:
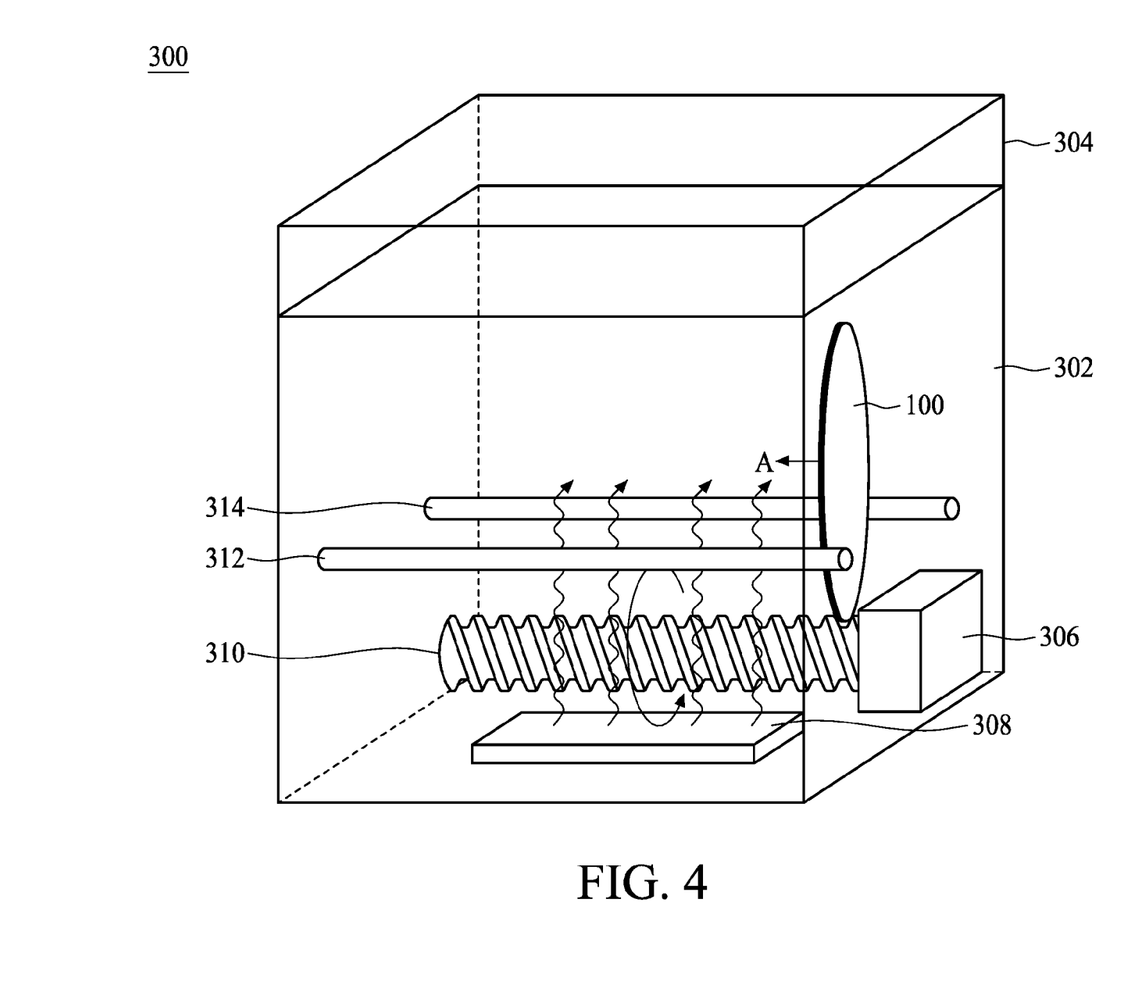
FIGS. 4-6 are intermediate stages of the process for weakening or debonding the bonding of the bonded wafers in accordance with an exemplary embodiment of the present disclosure.
Figure 5:
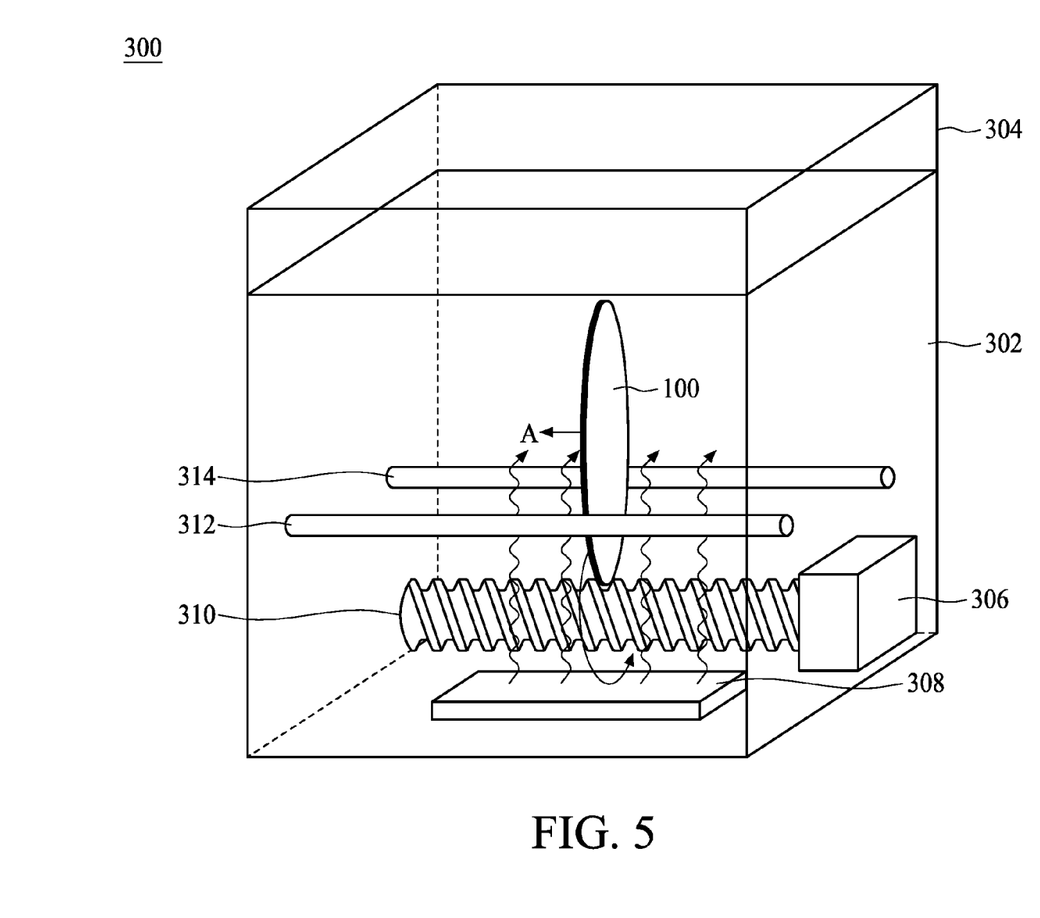
Figure 6:
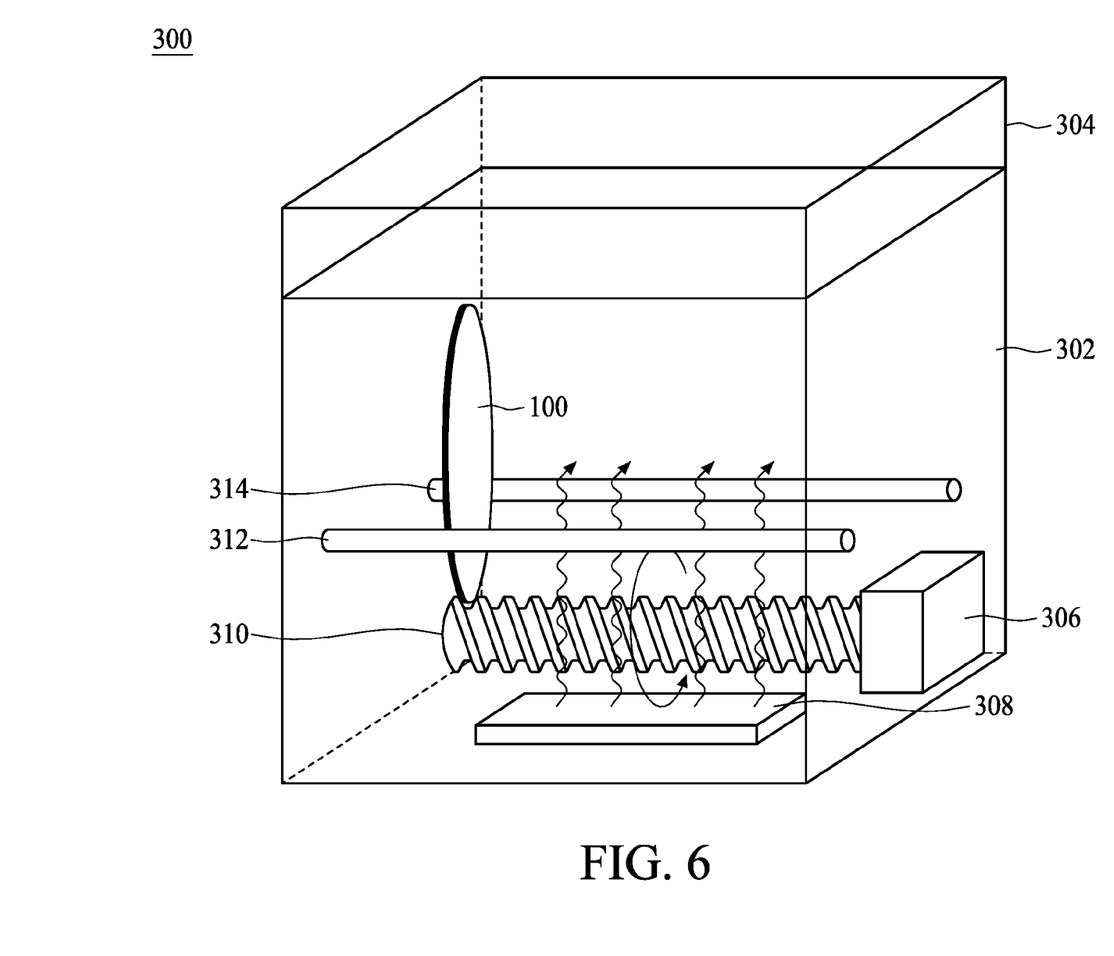

FIGS. 4-6 are intermediate stages of the process for weakening or debonding the bonding of the bonded wafers 100 in accordance with an exemplary embodiment of the present disclosure. In FIG. 4, the container 304 is filled with an ultrasonic transmitting medium 302. The ultrasonic transmitting medium 302 may be, for example, liquid. In the exemplary embodiment, the ultrasonic transmitting medium 302 may be comprised of water ($H_2O$). When the container 304 is filled with the ultrasonic transmitting medium 302, the ultrasonic wave producing means 308, the screw 310, the supporters 312 and 314 and the bonded wafers 100 are submerged in the ultrasonic transmitting medium 302 in the container 304. The bonded wafers 100 are disposed on one end of the screw 310. In this embodiment, as shown in FIG. 4, the bonded wafers 100 are disposed on the right end of the screw 310 adjacent to the right wall of the container 304. The depth of the ultrasonic transmitting medium 302 is preferably configured to allowing the bonded wafers 100 being completely submerged in the ultrasonic transmitting medium 302.

When the bonded wafers 100 are submerged in the ultrasonic transmitting medium 302, the ultrasonic wave producing means 308 may be therefore actuated to produce ultrasonic waves. The produced ultrasonic waves may be transferred through the ultrasonic transmitting medium 302 in certain or multiple directions. Such ultrasonic waves can be transmitted to the bonding interface of between the wafer 102 $a$ and the wafer 102$b$ and thereby weakening the bonding strength therebetween.

As mentioned herein above, the bonded wafers 100 are disposed on one end of the screw 310. In particular, since the screw thread pitch D is substantially greater than the thickness of the bonded wafers 100, the bonded wafers 100 can be inserted into the screw thread of the screw 310. The supporters 312 and 314 can further help to provide a three-point support to the bonded wafers 100. Through such a holding means comprised of the screw 310 and the supporters 312 and 314, the bonded wafers 100 can stand on the screw 310 vertical to the bottom base of the container 304. When the motor 306 initiates rotation of the screw 310, the screw thread of the screw 310 can drive the bonded wafers 100 to move along the screw thread of the screw 310 in a certain direction, for instance, move transversely across the container 304. For example, the motor 306 may initiate the screw 310 to rotate in a counterclockwise direction, the configuration of the screw thread of the screw 310 may drive the bonded wafers 100 to move along the screw thread of the screw 310 from the right end of the screw 310 toward the left end of the screw 310 as shown in FIG. 5. However, this is not a limitation of the present disclosure. In some embodiments, the configuration of the rotation direction and the screw thread of the screw 310 may be different from FIG. 4. For example, the bonded wafers 100 may be disposed on the left end of the screw 310 at beginning and drive toward the right end of the screw 310.

In particular, the rotation of the screw 310 can also drive the bonded wafers 100 to rotate accordingly through a contact interface between an edge of the bonded wafers 100 and the screw 310. As such, the holding and driving means of the present disclosure comprised of the screw 310, the motor 306, and the supporters 312 and 314 is applied to rotate the bonded wafers 100 about an axis through a center of the bonded wafers 100, and to move the bonded wafers 100 from one end of the screw 310 to another end of the screw 310. In this way, the ultrasonic wave produced by the ultrasonic wave producing means 308 can be more uniformly directed to the bonded wafers 100 thereby weakening the full area of the bonding interface between the wafers 102 $a$ and 102 $b$.

In FIG. 6, the bonded wafers 100 are moved to about the left end of the screw 310 and then may be removed from the container 304. The wafers 102 $a$ and 102 $b$ of the bonded wafers 100 may be already separated, or the full area of the bonding interface between the wafers 102 $a$ and 102 $b$ of the bonded wafers 100 may be only weakened but still not debonded. When the wafers 102 a and 102 b of the bonded wafers 100 is merely weakened but not separated, some existing debonding method may be further applied to the bonded wafers 100 after removing the bonded wafers 100 from the container 304. The subsequent debonding process may be easier since the bonding strength between the wafers 102 a and 102 b is weakened, so the created tensile bending stress or surface damages during the subsequent debonding process may be mitigated compared to performing the same without weakening the bonding strength first. The present disclosure avoids wafer breakage or detrimental effect on any functional devices already formed on the wafers, any destructive force or the tensile bending stress caused by the prying off or peeling process can also be dramatically reduced.

In order to ensure a desired result of the debonding process, some aspects regarding the system 300 may be taken into consideration. For example, the total time period that the bonded wafers 100 submerged in the ultrasonic transmitting medium 302 may affect the degree of weakening the bonding interface between the wafers 102 a and 102 b. A debonding time period may be determined in accordance with a bonding area, i.e., a total area of the insulator-to-insulator bonds 112 and/or the metal-to-metal bonds 114. For example, the debonding time period may be in proportional to the bonding area. When a longer debonding time is required, the motor 306 may be controlled to drive the screw 310 rotating in a slower speed, or the screw 310 may be elongated. Another aspect may be, for example, the specified acoustic power density per square centimeter of the ultrasonic waves produced by the ultrasonic wave producing means 308 may be adjusted in order to obtain the desired result of the debonding process. For example, for a bonded wafer 100 having a 50% of the bonding area with respect to an entire wafer area, acoustic power of 600 W and duration of 3 minutes, or alternatively, acoustic power of 300 W and duration of 6 minutes can effectively debond the bonded wafer 100. In some embodiments, lower acoustic power and shorter duration than those described above can be applied to at least weakening the bonding strength of bonded wafer.

In some embodiments, there may be more than one set of bonded wafers disposed on the screw 310. For example, two sets of bonded wafers may be disposed on the screw 310, and the two sets of bonded wafers may be distanced from each other a specified space.

In some embodiments, the ultrasonic transmitting medium 302 may be comprised of a wafer cleaning solution. When the container 304 is filled with the wafer cleaning solution, the bonded wafers 100 submerged therein can be cleaned and debonded at the same time. A typical wafer cleaning solution may be, for example, comprised of HF-SC1-SC2, wherein HF (Hydrofluoric acid) is a dilute HF solution used for etching thin layers of oxide. The wafer cleaning solution may be also comprised of a mixture of $NH_4OH$, $H_2O_2$, and $H_2O$. Sometimes the SC1 solution is also called the APM solution, which stands for Ammonia hydrogen Peroxide Mixture. The SC1 solution is mainly used for removing particles and residual organic contamination. The SC1 solution, however, leaves metallic contaminants behind. Another of the wafer cleaning solution may be a mixture of HCl, $H_2O_2$, and $H_2O$. Sometimes the SC2 solution is also called the HPM solution, which stands for Hydrochloric acid hydrogen Peroxide Mixture. The SC2 solution is mainly used for removing metallic contamination. The particular sequence of SC1 and SC2 is most often referred to as the RCA (Radio Corporation of America) cleaning sequence. Between the HF, SC1, and SC2 solutions there is usually a DI (de-ionized) water rinse. There is usually a DI water rinse after the SC2 solution. It is understood by one of ordinary skill in the art that using ultrasonic for wafer cleaning can be achieved by predetermined power and duration. In some embodiments, the debonding acoustic power and duration described above is sufficient to perform the wafer cleaning as well as the wafer debonding.

Figure 7:
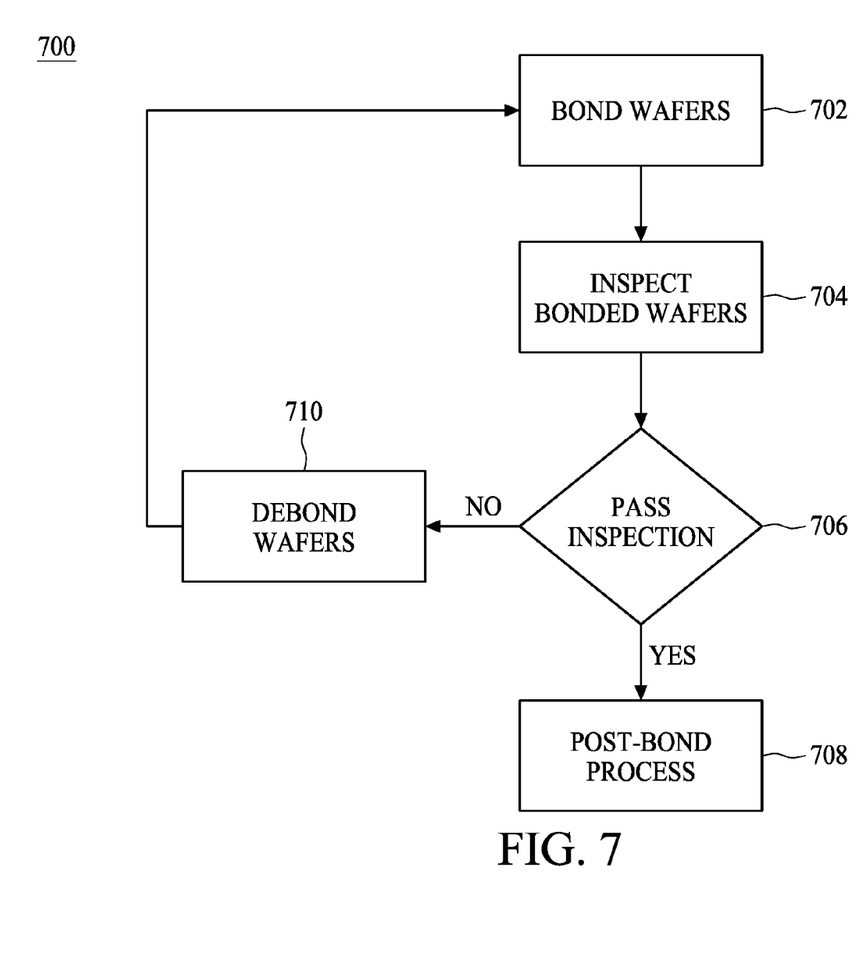
FIG. 7 is a flow chart illustrating a semiconductor manufacturing method in accordance with an embodiment of the present disclosure.

FIG. 7 is a flow chart illustrating a semiconductor manufacturing method 700 in accordance with an embodiment of the present disclosure. In step 702, the wafers 102 a and 102 b are bonded, and in step 704, the bonded wafers 100 are inspected. The bonded wafers 100 may be inspected by an infrared inspection tool, an acoustic microscope such as a C-mode scanning acoustic microscope (C-SAM), or other inspection devices, as examples. A bonding result is made as to whether the bonded wafers 100 pass inspection in step 706. If the bonded wafers 100 are determined to pass inspection, a post-bond process is performed on the bonded wafers 100, in step 708. The post-bonding process may include an anneal process that strengthens the insulator-to-insulator bonds 112 and/or the metal-to-metal bonds 114 of the bonded wafers 100, as an example. Alternatively, other types of post-bonding processes may be used. If the bonded wafers 100 do not pass inspection, the wafers 102 a and 102 b are de-bonded using the system 300 and methods described herein above, in step 710. Step 702 may then be repeated to re-bond the wafers 102 a and 102 b, in some embodiments.

Embodiments of the present disclosure include a method for weakening or debonding bonding of bonded wafers. Embodiments of the present disclosure also include a novel system 300 for performing the method for weakening or debonding bonding of bonded wafers. Furthermore, embodiments of the present disclosure include a semiconductor bonding method where the method for weakening or debonding bonding of bonded wafers is applied. Although in the embodiments mentioned herein above, the bonded wafers 100 shown in the drawings that include only two wafers 102 a and 102 b bonded together, the systems 300 and methods described herein may also be used to debond three or more wafers that have been bonded together. In some embodiments, the debonding methods may be repeated two or more times until the bonded wafers have been debonded, for example.

One embodiment of the present disclosure provides a semiconductor manufacturing method. The method includes: providing a first wafer and a second wafer, wherein the first wafer and the second wafer are bonded together; submerging the bonded first and second wafers in a ultrasonic transmitting medium; producing ultrasonic waves; and directing the ultrasonic waves to the bonded first and second wafers through the ultrasonic transmitting medium for a predetermined time period.

One embodiment of the present disclosure provides a semiconductor manufacturing method. The method includes: bonding a first wafer and a second wafer; determining a bonding result of the bonded first and second wafers; and determining whether to debond the bonded first and second wafers by ultrasonic waves in accordance with the bonding result.

One embodiment of the present disclosure provides a semiconductor manufacturing system for at least weakening a bonding strength of bonded wafers. The system includes: a container; an ultrasonic transmitting medium filled in the container; an ultrasonic wave producing means disposed in the ultrasonic transmitting medium for producing ultrasonic waves; and a supporter disposed in the ultrasonic transmitting medium for supporting the bonded wafers; wherein the ultrasonic waves is directed to the bonded wafers through the ultrasonic transmitting medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing method, comprising:
providing a first wafer and a second wafer, wherein the first wafer and the second wafer are bonded together;
submerging the bonded first and second wafers in an ultrasonic transmitting medium;
producing ultrasonic waves;
directing the ultrasonic waves to the bonded first and second wafers through the ultrasonic transmitting medium for a predetermined time period; and
controlling the bonded first and second wafers to laterally move in the ultrasonic transmitting medium when the ultrasonic waves are directed to the bonded first and second wafers.

2. The method of claim 1, wherein the directing of the ultrasonic waves to the bonded first and second wafers through the ultrasonic transmitting medium for the predetermined time period comprises:
directing the ultrasonic waves to the bonded first and second wafers through the ultrasonic transmitting medium for the predetermined time period to at least weaken a bonding strength of the bonded first and second wafers.

3. The method of claim 1, wherein the first wafer and the second wafer are bonded through a fusion bonding, an eutectic bonding, or a hybrid bonding.

4. The method of claim 1, further comprising:
determining the predetermined time period in accordance with a bonding area.

5. The method of claim 1, wherein the production of the ultrasonic waves comprises:
producing the ultrasonic waves in the ultrasonic transmitting medium.

6. The method of claim 5, wherein the production of the ultrasonic waves in the ultrasonic transmitting medium comprises:
producing the ultrasonic waves in the ultrasonic transmitting medium and beneath the bonded first and second wafers.

7. The method of claim 5, wherein the production of the ultrasonic waves in the ultrasonic transmitting medium comprises:
producing the ultrasonic waves in the ultrasonic transmitting medium and around the bonded first and second wafers.

8. The method of claim 1, wherein the controlling the bonded first and second wafers to laterally move in the ultrasonic transmitting medium when the ultrasonic waves are directed to the bonded first and second wafers comprises:
controlling the bonded first and second wafers to rotate in the ultrasonic transmitting medium when the ultrasonic waves are directed to the bonded first and second wafers.

9. The method of claim 1, wherein the directing of the ultrasonic waves to the bonded first and second wafers through the ultrasonic transmitting medium for the predetermined time period comprises:
directing the ultrasonic waves to the bonded first and second wafers through the ultrasonic transmitting medium for the predetermined time period to clean the bonded first and second wafers.

10. A semiconductor manufacturing method, comprising:
bonding a first wafer and a second wafer;
determining a bonding result of the bonded first and second wafers;
determining whether to debond the bonded first and second wafers by ultrasonic waves in accordance with the bonding result;
when it is determined to debond the bonded first and second wafers by ultrasonic waves, submerging the bonded first and second wafers in a ultrasonic transmitting medium;
producing ultrasonic waves;
directing the ultrasonic waves to the bonded first and second wafers through the ultrasonic transmitting medium for a predetermined time period to debond the bonded first and second wafers; and
controlling the bonded first and second wafers to laterally move in the ultrasonic transmitting medium when the ultrasonic waves are directed to the bonded first and second wafers.

11. The method of claim 10, wherein the first wafer and the second wafer are bonded through a fusion bonding, an eutectic bonding, or a hybrid bonding of thereof.

12. The method of claim 10, further comprising:
determining the predetermined time period in accordance with a bonding area.

13. The method of claim 10, wherein the production of the ultrasonic waves comprises:
producing the ultrasonic waves in the ultrasonic transmitting medium.

14. The method of claim 10, wherein the controlling the bonded first and second wafers to laterally move in the ultrasonic transmitting medium when the ultrasonic waves are directed to the bonded first and second wafers comprises:
controlling the bonded first and second wafers to rotate and laterally move in the ultrasonic transmitting medium when the ultrasonic waves are directed to the bonded first and second wafers.

15. The method of claim 10, further comprising:
when the first and second wafers are debonded, re-bonding the first wafer to the second wafer.

16. A semiconductor manufacturing method, comprising:
bonding a first wafer and a second wafer;
determining a bonding result of the bonded first and second wafers;
determining whether to debond the bonded first and second wafers in accordance with the bonding result;
when it is determined to debond the bonded first and second wafers, directing ultrasonic waves to the bonded first and second wafers through an ultrasonic transmitting medium to at least weaken a bonding strength of the bonded first and second wafers; and controlling the bonded first and second wafers to laterally move in the ultrasonic transmitting medium when the ultrasonic waves are directed to the bonded first and second wafers.

17. The method of claim 16, further comprising:
controlling the bonded first and second wafers to rotate and laterally move in the ultrasonic transmitting medium when the ultrasonic waves are directed to the bonded first and second wafers.

\* \* \* \* \*